(12) United States Patent
Vetter et al.

(10) Patent No.: US 9,905,533 B2
(45) Date of Patent: Feb. 27, 2018

(54) METHOD FOR PRODUCING A SEMI-CONDUCTOR ARRANGEMENT AND CORRESPONDING SEMI-CONDUCTOR ARRANGEMENT

(71) Applicant: AUDI AG, Ingolstadt (DE)

(72) Inventors: Günter Vetter, Burladingen (DE); Andreas Apelsmeier, Pollenfeld (DE); Henning Suckel, München (DE)

(73) Assignee: AUDI AG, Ingolstadt (DE)

( * ) Notice: Subject to any disclaimer, the term of this patent is extended or adjusted under 35 U.S.C. 154(b) by 0 days.

(21) Appl. No.: 15/514,304

(22) PCT Filed: Jul. 8, 2015

(86) PCT No.: PCT/EP2015/001393
§ 371 (c)(1),
(2) Date: Mar. 24, 2017

(87) PCT Pub. No.: WO2016/045758
PCT Pub. Date: Mar. 31, 2016

(65) Prior Publication Data
US 2017/0278822 A1 Sep. 28, 2017

(30) Foreign Application Priority Data
Sep. 27, 2014 (DE) .......... 10 2014 014 473

(51) Int. Cl.
*H01L 23/52* (2006.01)
*H01L 23/00* (2006.01)
*H01L 21/48* (2006.01)
*H01L 23/492* (2006.01)

(52) U.S. Cl.
CPC .......... *H01L 24/83* (2013.01); *H01L 21/4871* (2013.01); *H01L 23/492* (2013.01); *H01L 24/32* (2013.01); *H01L 2224/32227* (2013.01); *H01L 2224/8384* (2013.01); *H01L 2224/83385* (2013.01); *H01L 2924/1203* (2013.01);
(Continued)

(58) Field of Classification Search
CPC ..... H01L 24/32; H01L 24/83; H01L 21/4871; H01L 23/492
USPC ....................................... 257/782
See application file for complete search history.

(56) References Cited

U.S. PATENT DOCUMENTS

| 4,950,843 A | 8/1990 | Hirota |
| 6,459,147 B1 | 10/2002 | Crowley et al. |

(Continued)

FOREIGN PATENT DOCUMENTS

| CN | 101521188 | 9/2009 |
| DE | 10 2007 037 538 | 2/2009 |

(Continued)

*Primary Examiner* — Luan C Thai
(74) *Attorney, Agent, or Firm* — Henry M. Feiereisen LLC

(57) ABSTRACT

A method for producing a semiconductor arrangement, said method includes fastening a semiconductor on a base element by means of a sintered layer, wherein a side of the sintered layer which faces the base element is configured planar; and perforating a region of the base element, which directly contacts the sinter, wherein the perforating includes generating a plurality of through-openings having a closed border in the region of the base element for adjusting a stiffness of at least a portion of the base element in a targeted manner

8 Claims, 2 Drawing Sheets

(52) U.S. Cl.
CPC ........... *H01L 2924/13055* (2013.01); *H01L 2924/13091* (2013.01); *H01L 2924/3512* (2013.01)

(56) References Cited

U.S. PATENT DOCUMENTS

| | | | |
|---|---|---|---|
| 6,838,750 B2 * | 1/2005 | Nuytkens | ............ H01L 21/4846 257/324 |
| 6,921,971 B2 * | 7/2005 | Basho | ................... H01L 23/057 257/675 |
| 7,786,558 B2 | 8/2010 | Otremba | |
| 2003/0075785 A1 | 4/2003 | Crowley et al. | |
| 2005/0127134 A1 | 6/2005 | Lu et al. | |
| 2005/0242417 A1 * | 11/2005 | Youn | ................. H01L 23/49503 257/676 |
| 2014/0001244 A1 | 1/2014 | Wolde-Giorgis et al. | |

FOREIGN PATENT DOCUMENTS

| | | |
|---|---|---|
| DE | 20 2009 000 615 | 7/2010 |
| DE | 10 2012 204 159 | 3/2013 |
| DE | 10 2013 204 883 | 9/2014 |

* cited by examiner

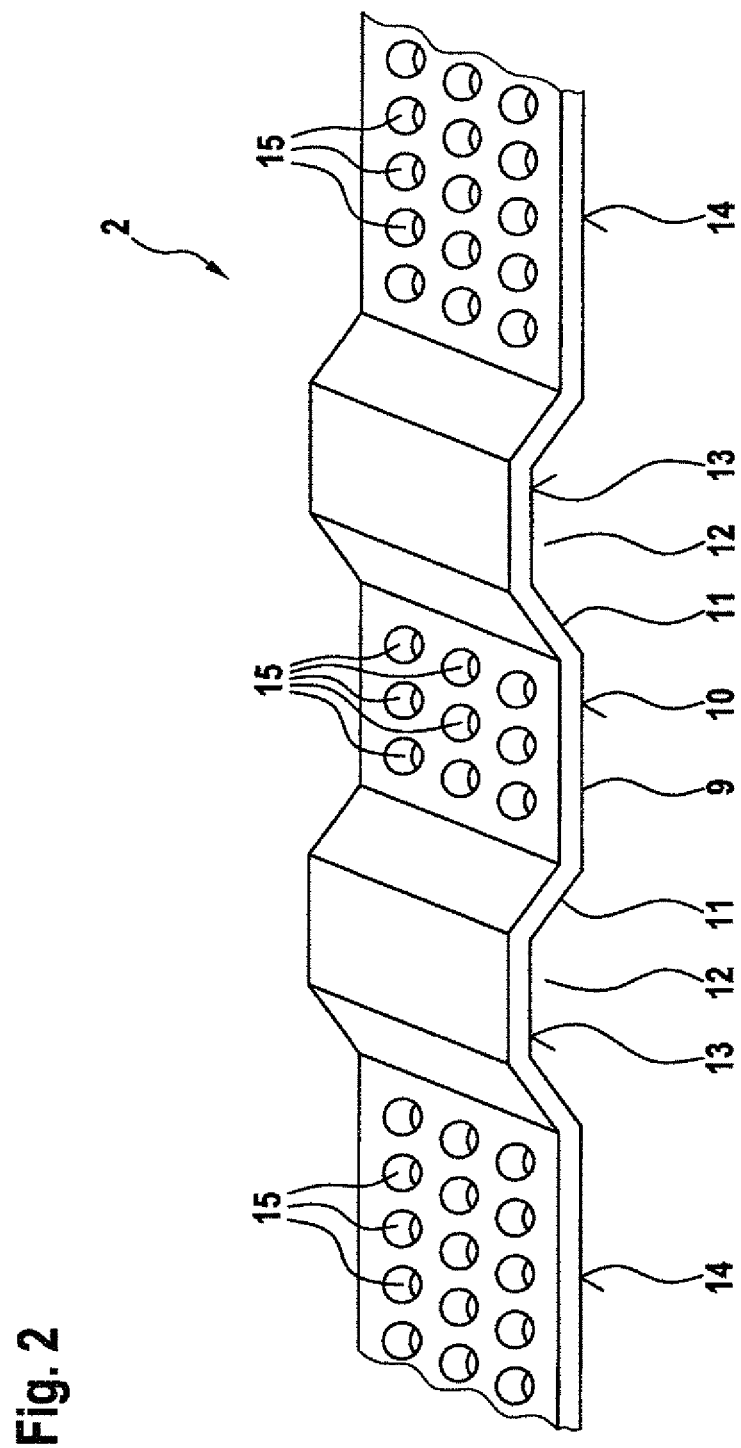

METHOD FOR PRODUCING A SEMI-CONDUCTOR ARRANGEMENT AND CORRESPONDING SEMI-CONDUCTOR ARRANGEMENT

CROSS-REFERENCES TO RELATED APPLICATIONS

This application is the U.S. National Stage of International Application No. PCT/EP2015/001393, filed Jul. 8, 2015, which designated the United States and has been published as International Publication No, WO 2016/045758 and which claims the priority of German Patent Application, Serial No. 10 2014 014 473.9, filed Sep. 27, 2014, pursuant to 35 U.S.C. 119(a)-(d),

BACKGROUND OF THE INVENTION

The invention relates a method for producing a semiconductor arrangement with at least one base element and a semiconductor, wherein the semiconductor is fastened on the base element by means of a center layer. The invention also relates to a semiconductor arrangement.

The semiconductor arrangement is made at least of the base element and the semiconductor. The base element is for example a base plate or a bottom plate. The base element can serve as a cooling body via which heat generated at the semiconductor can be dissipated to an environment of the semiconductor arrangement. The semiconductor is preferably fastened solder-free on the base element, i.e., in the absence of solder. For this purpose the at least one center layer is provided, which is situated between the semiconductor and the base element.

The center layer does not necessarily directly contact the base element and/or the semiconductor, i.e., for example the center layer does not necessarily have to be arranged between the base element and the semiconductor. Rather it may be provided that at least one intermediate layer is present between the base element and the semiconductor.

It can be provided that this intermediate layer is fastened on the base element by means of the sintered layer, in particular directly so that as a result the sintered layer contacts the intermediate layer on one side and the base element on the other side. A further sintered layer can serve for fastening the semiconductor on the intermediate layer, so that for example the further sintered layer contacts the semiconductor as well as the intermediate layer.

During operation of such a semiconductor arrangement significant temperature stress may occur, which generates thermal tensions, which in particular act on the semiconductor and/or the sintered layer. This may lead to accelerated aging of the semiconductor arrangement, in particular due to cracks that may form in the center layer.

SUMMARY OF THE INVENTION

It is therefore an object of the invention to propose a method for producing a semiconductor arrangement, which has advantages compared to the state of the art and in particular avoids or at least reduces the mentioned disadvantage of crack formation due to thermal tensions.

This is achieved according to the invention with a method with the features of the independent claim. Hereby it is provided that a region of the base element, which directly contacts the sintered layer, is at least partially perforated. In at least one region of the base element the sintered layer is thus in contact with this region. This region is at least partially perforated, i.e., it is provided with at least one recess.

The recess can generally be configured arbitrarily. The recess can for example have the form of a through-opening or a blind recess, wherein the former traverses the base element while the latter has a closed bottom. The blind recess is preferably only open in the direction of the sintered layer, i.e., it traverses a surface of the base element in that region with which the sintered layer is in direct contact.

By means of the perforation the stiffness of the base element can be adjusted in a targeted manner and thus its expansion behavior can be influenced. In this way the stress on the sintered layer due to thermal tensions is significantly reduced thereby improving the service life of the semiconductor arrangement.

In a further embodiment of the invention it is provided that the perforation is performed prior to the fastening of the semiconductor on the base element. The base element thus has the perforation or the at least one recess already prior to the process of the sintering and/or the application of the green compact from which the sintered layer is made. This generally constitutes the simplest and most cost effective configuration.

In addition the perforation also improves the fastening by means of the sintered layer because the sintered layer or the green compact for the sintered layer can be introduced at least in regions into the perforation or the at least one recess when being applied onto the base element. However, this is only optional. Of course the sintered layer or the green compact can also be configured planar on its side that faces the base element or can rest planar against the base element.

In a further preferred embodiment of the invention it is provided that the perforating includes generating at least one recess, in particular a plurality of recesses including the region of the base element. As mentioned above the perforation includes the at least one recess. However, particularly preferably a plurality of recesses is realized, wherein the recesses are in particular spaced apart from each other in the region of the base element. Hereby the recesses can be identical or different from each other.

For example at least a subset of the recess, in particular all recesses, are circular in cross section. However a further subset of the recesses or, as an alternative, all recesses can be configured as oblong holes, i.e., they can for example have an oval or stadium-like cross section. The latter means that when viewed in cross section the recess is delimited by two parallel lines, which are connected on both sides by a curved line, for example a semicircle.

In addition or as an alternative at least a subset of the recesses can be configured as a through-opening. Preferably all recesses are configured as through-openings. However in addition or as alternative a further subset can be configured as blind recess. For example all recesses are configured as blind recesses. In an embodiment the recesses can have the same distance to each other. However, they can also be arranged unevenly distributed over the region.

In a further embodiment of the invention it is provided that the at least one recess is configured as a through-opening with a closed border. The configuration of the recess as through-opening was mentioned above. This means that the recess completely traverses the base element. However, the recess is to be present in the base element so that when viewed in cross section the recess has a closed border, i.e., when viewed in cross section it has a closed boundary. The recess is in particular not to traverse a border of the base element.

In a further preferred embodiment of the invention it is provided that the base element has a planar surface, which is traversed by the at least one recess and which the sintered layer contacts after fastening of the semiconductor. The region of the base element, which the sintered layer contacts, is thus planar or is configured as a planar surface.

An embodiment of the invention provides that the base element is configured so that a region of the base element, which is angled with respect to the surface, adjoins the planar surface. The base element is insofar not configured completely planar but besides the planar surface, which the sintered layer contacts, has the angled region. For example the angled region is also planar and encloses with the planar surface an angle of at least 10°, at least 20°, at least 30°, at least 40°, at least 45°, at least 50°, at least 60°, at least 70°, at least 80° or exactly 90°. The angle is in any case at most 90°.

It can be provided that such an angled region respectively directly adjoins the planar surface on both sides of the planar surface. In addition or as an alternative it can be provided that on a side of the region, which faces away from the planar surface, a further planar surface adjoins, which can be parallel to the planar surface. In other words regions, which in normal direction of the planar surface are spaced farther apart from the sintered layer than the planar surface, adjoin the region of the base element, which i sin direct contact with the sintered layer. Preferably these further regions are not perforated but are constructed solid. These regions can in particular be configured as cooling ribs via which heat generated at the semiconductor is dissipated to the environment of the semiconductor arrangement.

In an embodiment of the invention it is provided that prior to the fastening a contact layer is applied on the semiconductor. The semiconductor is thus not directly fastened on the base element but rather indirectly via the contact layer by means of the sintered layer. Fastening of the contact layer on the base element is in particular performed by means of the sintered layer, so that the sintered layer is in direct contact with the base element as well as with the contact layer.

In an advantageous embodiment of the invention it is provided that a DCB-layer or an IMS-layer is used as contact layer. The contact layer can thus also be referred to as DCB-substrate and the IMS layer as IMS-substrate. The term DCB-substrate means a multilayered construction made of two outer copper layers and an intermediate layer. The intermediate layer is for example made of ceramic or aluminum, in particular of $AL_2O_3$, $Si_3N_4$ or AlN. The term IMS-layer (IMS: Insulated Metal Substrate) means for example an aluminum core conductor plate.

Finally it can be provided that an IGBT, a diode or a MOSFET is used as semiconductor. However, the semiconductor can generally be configured arbitrarily. However, in the mentioned embodiments the problem of the thermal tension is particularly pronounced.

The invention also relates to a semiconductor arrangement, in particular produced according to the description above with at least one base element and a semiconductor, wherein the semiconductor is fastened on the base element by means of the sintered layer. Hereby it is provided that a region of the base element, which directly contacts the sintered layer, is perforated at least in regions. The advantages of such a configuration of the semiconductor arrangement or the method were described above. The semiconductor arrangement as well as the method can be further refined according to the description above so that reference is made thereto.

BRIEF DESCRIPTION OF THE DRAWING

In the following the invention is explained in more detail by way of the exemplary embodiments shown in the drawing without limiting the invention. Hereby it is shown in FIG. 1 a cross sectional view through a region of a semiconductor arrangement, which has a base element and a semiconductor fastened on the base element by means of a sintered layer, and FIG. 2 a detail view of the base element.

DETAILED DESCRIPTION OF PREFERRED EMBODIMENTS

Figure 1:
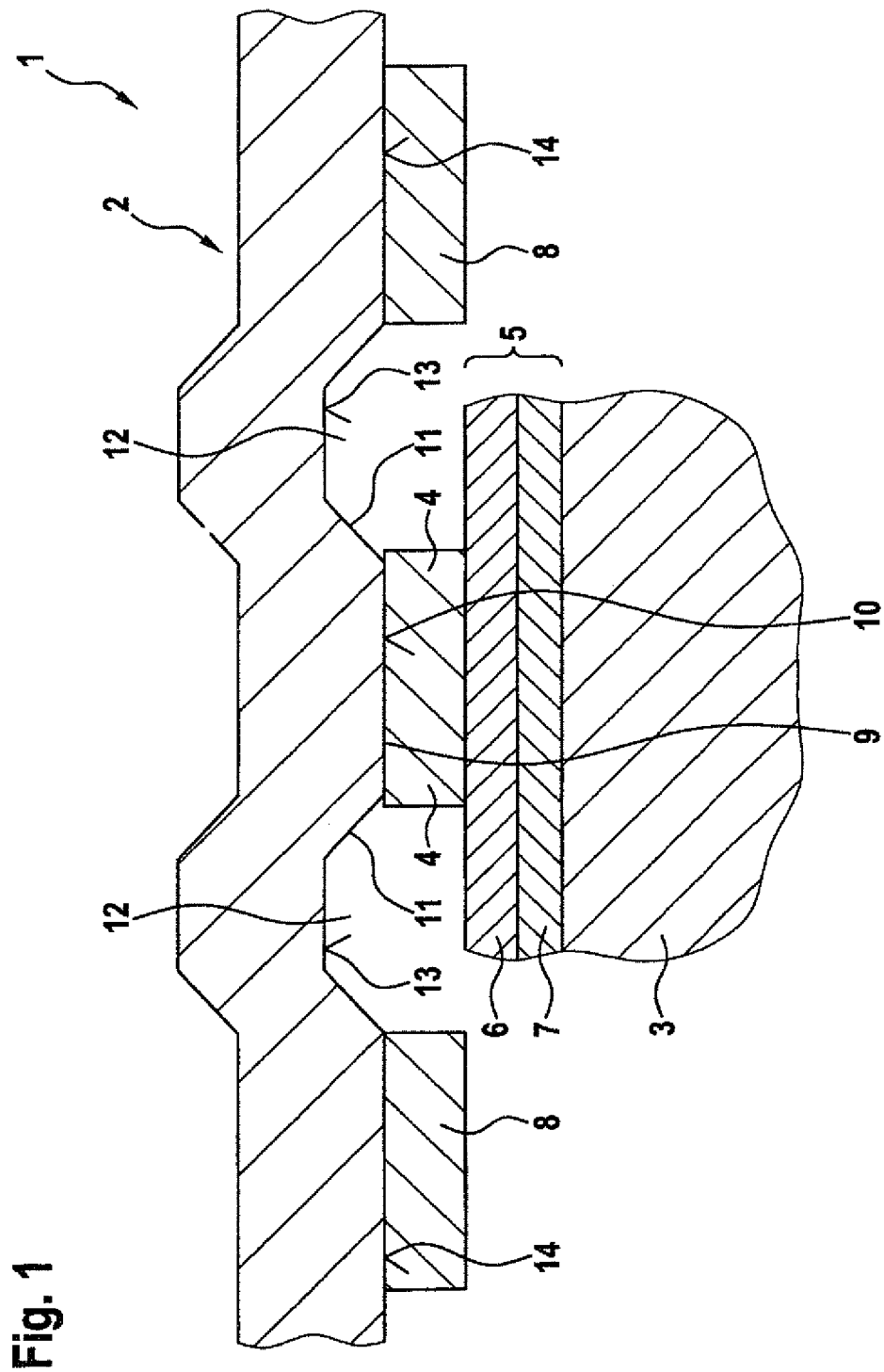

FIG. 1 shows a cross sectional view of a semiconductor arrangement 1 with a base element 2 and a semiconductor 3, of which here only a section is shown. The semiconductor 3 is fastened on the base element 2 by means of a sintered layer 4. For this purpose the sintered layer 4 engages on one side directly on the base element 2 and on the other side directly on the contact layer 5, which is for example configured as a DCB-layer and thus has a copper layer 6 and a substrate layer 7. The substrate layer 7 is preferably made of $Al_2O_3$.

Besides the sintered layer 4 at least one further sintered layer, in the here shown exemplary embodiment two further sintered layers 8, can be provided. The sintered layer 8 directly contacts the base element 2 in a region 9 of the base element, wherein the base element 2 in this region has a planar surface 10. In the here shown view of the semiconductor arrangement 1 it can be seen that an angled region 11 of the base element 2 adjoins this planar surface 10. Preferably such a region 11 is present on each side of the surface 10.

As a result of the regions 11 indentations 12 are formed in the base element 2, with the base 13 of the indentations preferably being planar and extending parallel to the planar surface 10. On the side of the indentation 12 that faces away from the surface 10 or the substrate layer 7 a further planar surface 14 can be present. The surface 14 can be parallel to the surface 10 and/or be situated in the same imagined plane as the surface 10.

FIG. 2 shows a detail view of the base element 2. It can be seen that the base element 2 in the region 9, which is in direct contact with the sintered layer 4 (here not shown), is perforated at least in regions, i.e., it has at least one recess 15, in particular a plurality of recesses 15 of which here only one is exemplarily shown. Analogously, the surface 14 on which a sintered layer 8 can also be arranged, can also be provided with at least one such recess 15. Also here only some of the recesses 15 are exemplarily indicated. It can be seen that the recesses 15 are formed as through-openings and in cross section have a closed border and are circular. Of course the recesses 15 can also be configured as blind recesses and/or can have any other cross sectional configuration.

By means of the perforation of the region 9 and preferably also of the surface 14 the stiffness of the base element 2 can be reduced in regions thus facilitating elastic deformation of the base element 2 in the case of thermal tensions between the sintered layer 4 and the base element 2. In this way damage to the sintered layer 4 and/or the semiconductor 3 due to these thermal tensions is prevented or at least reduced.

What is claimed is:

1. A method for producing a semiconductor arrangement, said method comprising:

fastening a semiconductor on a base element by means of a sintered layer, wherein a side of the sintered layer which faces the base element is configured planar; and perforating a region of the base element, which directly contacts the sintered layer, said perforating comprising generating a plurality of recesses configured as through-openings having a closed border in the region of the base element for adjusting a stiffness of at least a portion of the base element in a targeted manner.

2. The method of claim 1, wherein the perforating is performed prior to the fastening of the semiconductor on the base element.

3. The method of claim 1, wherein the region of the base element comprises a planar surface, which is traversed by the plurality of through-openings and after the fastening of the semiconductor contacts the sintered layer.

4. The method of claim 3, wherein the base element has a further region which adjoins the planar surface and is angled with respect to the planar surface.

5. The method of claim 1, further comprising prior to the fastening step applying a contact layer on the semiconductor.

6. The method of claim 5, wherein the contact layer is a DCB-layer or an IMS-layer.

7. The method of claim 1, wherein the semiconductor is one of an IGBT, a diode and a MOSFET.

8. A semiconductor arrangement, comprising:
at least one base element; and
a semiconductor fastened on the base element by means of a sintered layer,
wherein a side of the sintered layer which faces the base element is configured planar, and wherein a region of the base element which directly contacts the sintered layer has a plurality of recesses configured as through-openings with a closed border for adjusting a stiffness of at least a portion of the base element in a targeted manner.

* * * * *